(12) United States Patent
Ukei et al.

(10) Patent No.: US 6,239,603 B1
(45) Date of Patent: May 29, 2001

(54) MONITOR TEG TEST CIRCUIT

(75) Inventors: Toshio Ukei, Yamato; Hiroshi Aoyagi, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/338,436

(22) Filed: Jun. 23, 1999

(30) Foreign Application Priority Data

Jun. 24, 1998 (JP) .................................................. 10-177313

(51) Int. Cl.[7] .................................................. G01R 31/28
(52) U.S. Cl. ............................ 324/763; 324/765; 714/733
(58) Field of Search ................................... 324/763, 765, 324/73.1, 158.1; 714/733, 734; 257/48

(56) References Cited

U.S. PATENT DOCUMENTS

| | | | |
|---|---|---|---|
| 3,961,251 | * 6/1976 | Hurley et al. | 714/733 |
| 4,243,937 | * 1/1981 | Multani et al. | 324/765 |
| 4,336,495 | * 6/1982 | Hapke | 324/765 |
| 4,719,411 | * 1/1988 | Buehler | 324/73.1 |
| 4,743,841 | * 5/1988 | Takeuchi | 324/763 |
| 4,782,283 | * 11/1988 | Zasio | 324/763 |
| 4,970,454 | * 11/1990 | Stambaugh et al. | 324/765 |
| 5,703,381 | * 12/1997 | Iwasa et al. | 257/48 |
| 6,049,218 | * 4/2000 | Storino et al. | 324/763 |

FOREIGN PATENT DOCUMENTS 3-228353  10/1991  (JP) .

* cited by examiner

*Primary Examiner*—Ernest Karlsen
(74) *Attorney, Agent, or Firm*—Oblon, Spivak, McClelland, Maier & Neustadt, P.C.

(57) ABSTRACT

Monitor TEGs (Test Element Groups) for extracting the effects of process variations within a semiconductor chip and a test circuit therefor are provided to allow the monitor TEGs to be tested after package sealing. A plurality of monitor TEGs and a control circuit for selectively enabling the monitor TEGs are formed on the same chip as a semiconductor device is formed. The monitor TEGs are placed in selected positions in the chip and selectively monitored via test signals, thereby implementing process parameter monitoring by means of the device parameter variations within the finished chip. The external terminals of the semiconductor device are configured such that they are programmed via enable signals to serve as input/output terminals of the test signals, keeping the number of the external terminals of the semiconductor device from increasing for the testing purpose.

10 Claims, 4 Drawing Sheets

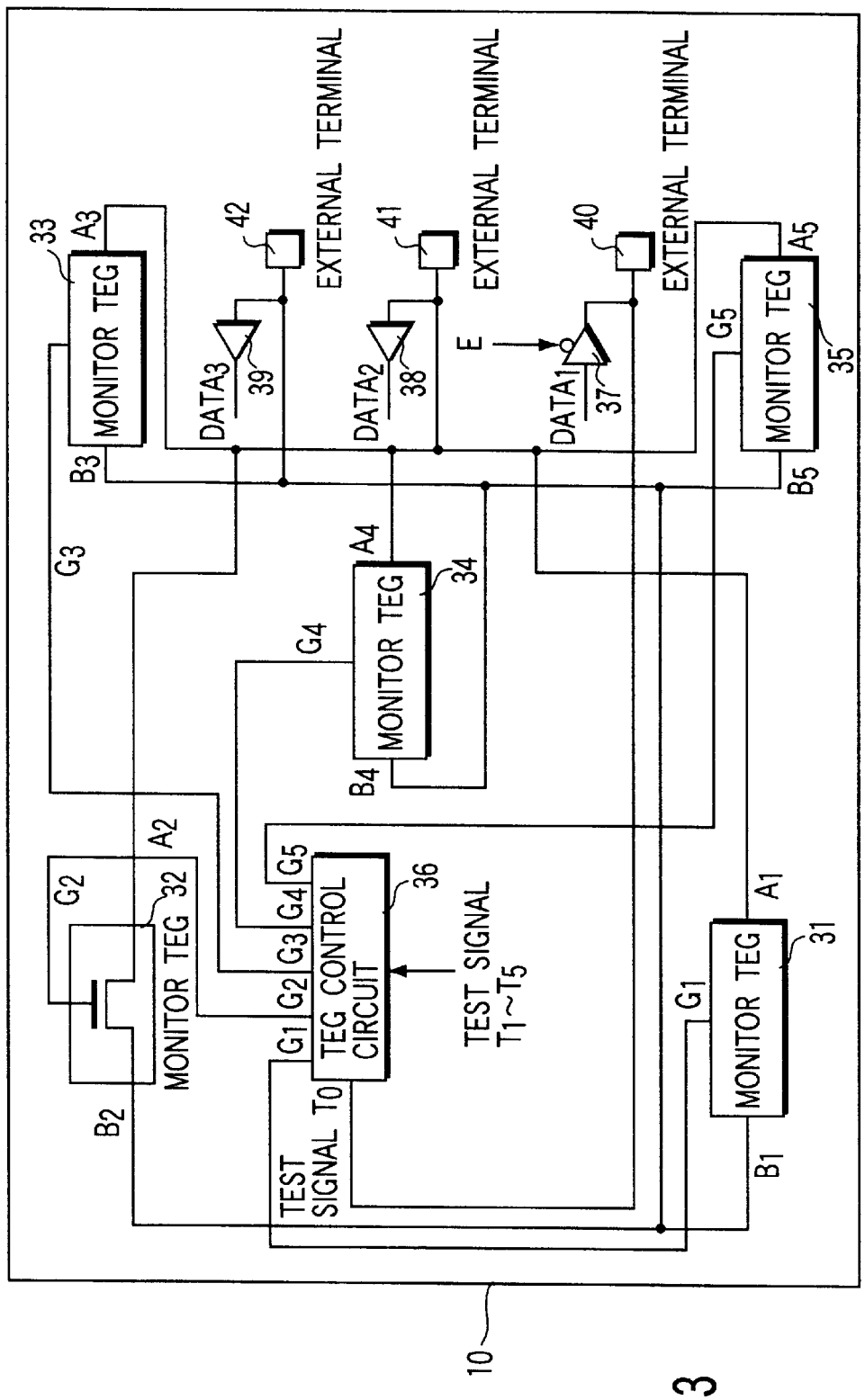
F I G. 3

MONITOR TEG TEST CIRCUIT

BACKGROUND OF THE INVENTION

1. Field of the Invention

The present invention relates to a test circuit for semiconductor devices and more specifically to a test circuit for a plurality of monitor TEGs (Test Element Groups) that monitors variations in process parameters in a semiconductor chip.

2. Discussion of the Background

With advances in manufacturing processes for miniaturization and high integration of semiconductor devices, reducing device parameter deviations within wafers and within chips due to process parameter variations has become an important problem in the improvement of semiconductor device manufacturing yields.

Conventionally, for process parameter monitoring, in-wafer TEGs (Test Element Groups), dicing line TEGs (TEGs in dicing line regions), and in-chip discrete element TEGs have been employed. However, they are insufficient as monitor TEGs for evaluating variations in process parameters for each chip. In view of monitoring process parameter variations within a chip, the demand has increased for a monitor TEG test circuit that allows process parameter variations to be evaluated with precision.

Here, the process parameter monitoring is to monitor deviations of characteristics of components of semiconductor devices from their design values due to variations in process parameters. The components to be monitored include discrete components, such as diffused resistors, diodes, transistors, etc., circuits, such as inverters, ring oscillators, etc., wiring TEGs each consisting of a group of contact holes and cross-over wirings, and so on.

The monitor TEGs are tested mainly in the middle of wafer processing in order to locate as early as possible faults due to variations in processing conditions. The wafer is diced into chips and the resultant chips are sealed in packages. After that, using an LSI tester good ones are selected out of packaged semiconductor devices and then shipped.

The causes of faults found after packaging are analyzed using an SEM (Scanning Electron Microscope) with the packages opened and then used to improve the manufacturing process. However, such a conventional destructive fault analysis method involves much time and effort. The fact is that effective feedback of fault data due to variations in wafer processing is considerably difficult.

That is, the main objective of the conventional monitor TEG-based intermediate testing in the wafer processing is to detect variations in the wafer processing as early as possible and contribute to the improvement of the manufacturing process.

SUMMARY OF THE INVENTION

Although, as described above, the conventional monitor TEG testing has been mainly intended to evaluate the effects of variations in process parameters within a wafer, among wafers, and among manufacturing lots, the advances in microstructuring and high-integration technology for semiconductor devices have increased the demand for monitor TEGs for evaluating variations in process parameters with precision and the development of a test circuit therefor in order to examine the effects of process variations within a chip.

The conventional monitor TEG testing can be carried out only in the middle of wafer processing. The monitor TEGs cannot be utilized for the shipment test after packaging, the reliability test, and the fault analysis for devices failed in the user site.

It is a first object of the present invention to provide monitor TEGs and a test circuit therefor which allow the effects of process parameter variations within a semiconductor chip to be evaluated with precision for an analysis of reductions in manufacturing yields of large-scale integration semiconductor devices.

It is a second object of the present invention to allow monitor TEG test results to be output with ease and at any point of time by forming monitor TEGs and a test circuit therefor on a semiconductor chip together with a semiconductor device and inputting test signals after package sealing (including plastic molding).

A monitor TEG test circuit of the present invention comprises a plurality of monitor TEGs for extracting the effects of process parameter variations placed in selected positions scattered in a chip and a circuit for selectively controlling the monitor TEGs, and selectively monitors the monitor TEGs by using test signals, thereby implementing process monitoring for process parameter variations.

In addition, the terminals for test signals are used in common with the external terminals of the semiconductor device by means of programmable enable signals, thereby keeping the external terminals from increasing for the testing purpose.

Specifically, the monitor TEG test circuit of the present invention is characterized by monitoring process parameter variations within a chip by forming the plurality of monitor TEGs and the semiconductor device on the same chip and selectively testing the monitor TEGs.

Preferably, the external terminals of the semiconductor device are programmably diverted by the test signals to input/output terminals of the monitor TEG test circuit.

According to an aspect of the present invention, there is provided a test circuit for n (n is an integer of more than one) number of monitor TEGs which are formed on the same chip as a semiconductor device is formed and placed in selected positions in the chip, wherein each of the monitor TEGs consists of a ring oscillator, and the test circuit comprising: a TEG control circuit responsive to externally applied test signals $T_0$ and $T_1$ to $T_n$ for outputting control signals $G_1$ to $G_n$ to control the number n of monitor TEGs, respectively; an n-input NOR gate or n-input OR gate responsive to outputs $A_1$ to $A_n$ of the monitor TEGs for outputting one of the outputs $A_1$ to $A_n$ Of the monitor TEGs; at least one data output terminal of the semiconductor device which is diverted by an enable signal to an input terminal for one of the test signals $T_0$ and $T_1$ to $T_n$; and a data output terminal of the semiconductor device which is diverted by an enable signal to an output terminal for the output of the n-input NOR or OR gate, the at least one data output terminal of the semiconductor device being connected to an input of the TEG control circuit, outputs of the TEG control circuit for outputting the control signals $G_1$ to $G_n$ being connected to the inputs of the monitor TEGs, respectively, and the output of the n-input NOR or OR gate being connected to the data output terminal of the semiconductor device.

Preferably, the ring oscillator has a two-input NOR gate to receive a corresponding one of the control signals $G_1$ to $G_n$.

Preferably, the TEG control circuit comprises n number of two-input NAND gates each having its input connected to receive the test signal $T_0$ and its other input connected to receive a respective one of the test signals $T_1$ to $T_n$ and providing a respective one of the control signals $G_1$ to $G_n$.

According to another aspect of the present invention, there is provided a test circuit for an n (n is an integer of more than one) number of monitor TEGs which are formed on the same chip as a semiconductor device is formed and placed in selected positions in the chip, wherein each of the monitor TEGs consists of a three-terminal elements having first, second and third terminals, and the test circuit comprising: a TEG control circuit responsive to externally applied test signals $T_0$ and $T_1$ to $T_n$ for outputting control signals $G_1$ to $G_n$ to control the n number of monitor TEGs, respectively; a first external terminal for inputting first input data to the semiconductor device via a buffer circuit; a second external terminal for inputting second input data to the semiconductor device via a buffer circuit; and at least one data output terminal of the semiconductor device which is diverted by an enable signal to an input terminal for one of the test signals $T_0$ and $T_1$ to $T_n$, the at least one data output terminal of the semiconductor device being connected to an input of the TEG control circuit, the three-terminal element in each of the monitor TEGs having its first terminal connected to the first external terminal, its second terminal connected to the second external terminal and its third terminal connected to receive a corresponding one of the control signals $G_1$ to $G_n$ from the TEG control circuit.

Preferably, the three-terminal element is a MOS transistor, and the first, second and third terminals of the three-terminal element are the source, drain, and gate, respectively, of the MOS transistor.

Preferably, the TEG control circuit comprises an n number of partial circuits connected in parallel each of which comprises first and second MOS transistors and one inverter, each of the partial circuits having a first input connected to receive the test signal $T_0$ at the source of the corresponding first MOS transistor, a second input connected to receive a respective one of the test signals $T_1$ to $T_n$ at the input of the corresponding inverter, and an output connected in common to the drains of the corresponding first and second MOS transistors for providing a corresponding one of the output signals $G_1$ to $G_n$, the second MOS transistor having its gate connected to the output of the corresponding inverter and its source connected to a reference voltage.

Preferably, the test signal $T_0$ is used in common as the enable signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows an arrangement of a monitor TEG test circuit according to a second embodiment of the present invention.

DETAILED DESCRIPTION OF THE PREFERRED EMBODIMENTS

Figure 1:
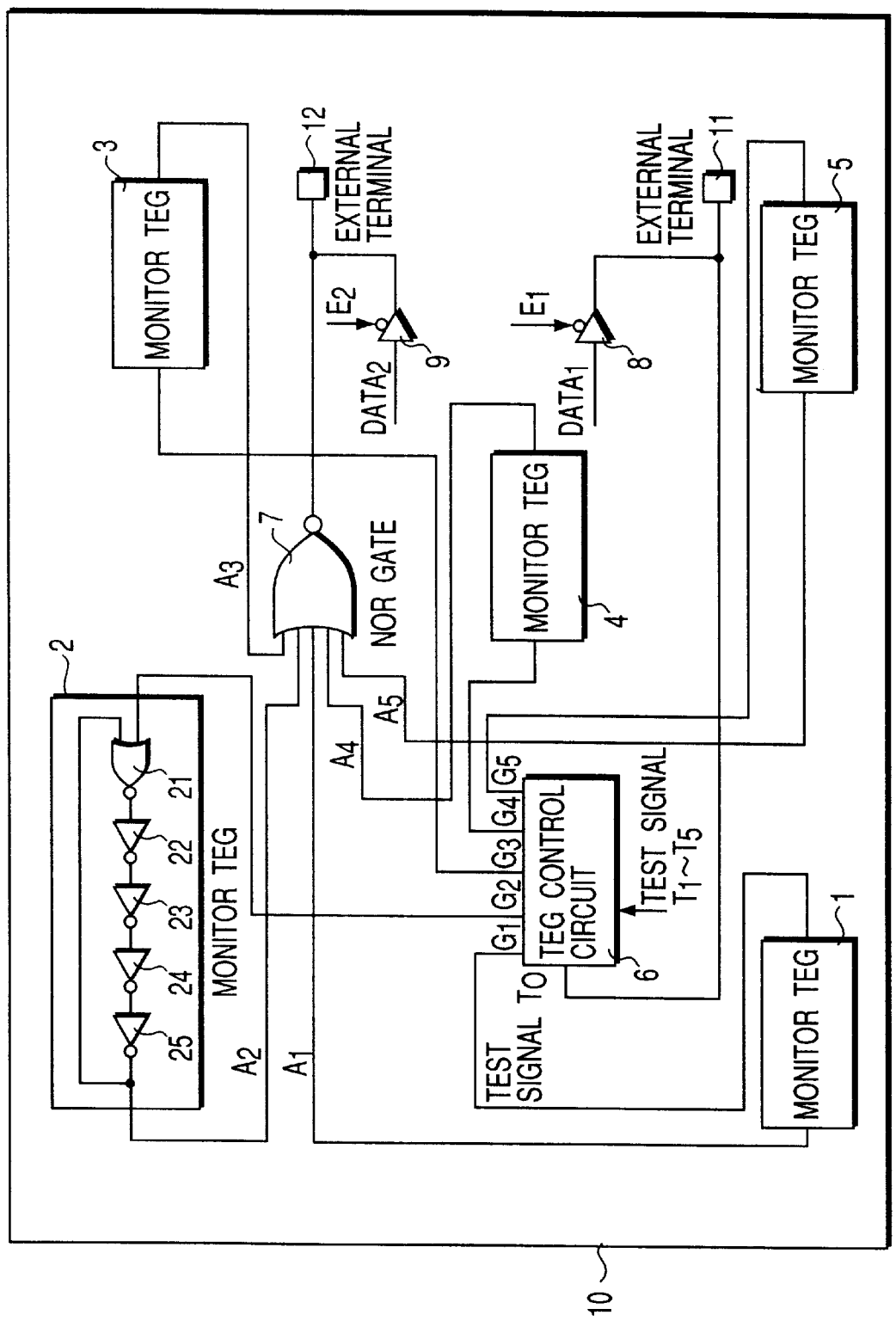
FIG. 1 shows an arrangement of a monitor TEG test circuit according to a first embodiment of the present invention.

Referring now to the drawings, wherein like reference numerals designate identical or corresponding parts throughout the several views, and more particularly to FIGS. 1–4 thereof, there are illustrated various exemplary embodiments of the present invention.

FIG. 1 shows a test circuit for monitor TEGs formed in a semiconductor chip according to a first embodiment of the present invention.

The monitor TEG test circuit shown in FIG. 1 comprises a plurality of monitor TEGs 1 to 5 formed at the four corners of and on the inside of a semiconductor chip 10, each TEG consisting of a ring oscillator, a TEG control circuit 6 for selectively controlling the monitor TEGs, a five-input NOR gate 7 connected at its inputs to receive output signals $A_1$ to $A_5$ of the respective monitor TEGs 1 to 5 and having its output connected to an external terminal 12, and an external terminal 11 for inputting a test signal $T_0$ to the TEG control circuit.

Figure 2:
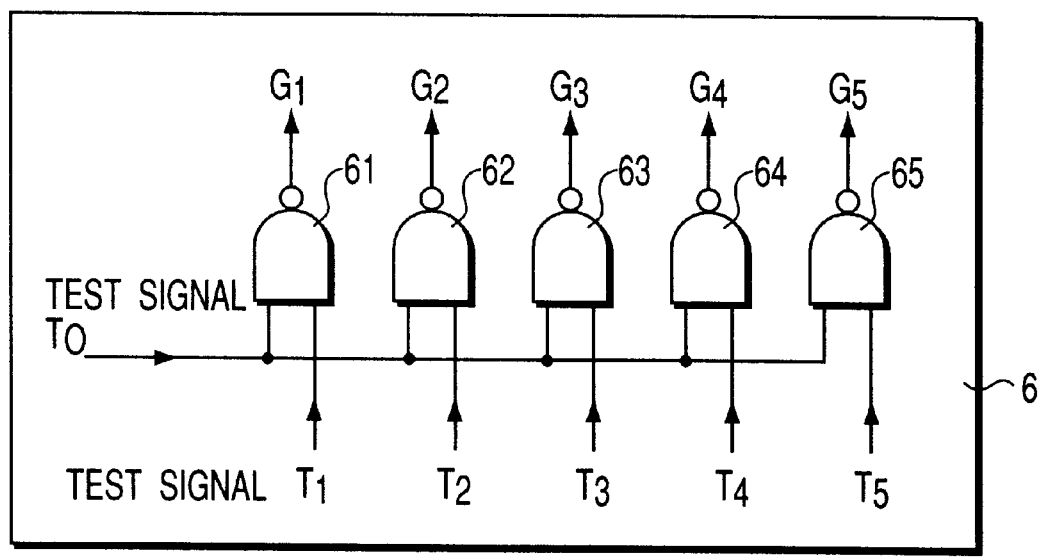
FIG. 2 shows an arrangement of the TEG control circuit of FIG. 1.

The TEG control circuit 6 is connected to receive test signals $T_1$ to $T_5$ as well as the test signal $T_0$ and to output control signals $G_1$ to $G_5$ to the monitor TEGs 1 to 5. With the external terminals 11 and 12 are respectively associated enable gates 8 and 9 which permit output data $DATA_1$ and $DATA_2$ of a semiconductor device formed on the same chip to be output to outside. FIG. 2 shows an arrangement of the TEG control circuit 6, which comprises five two-input NAND gates 61 to 65 each of which is connected at its two inputs to receive the test signal $T_0$ and a respective one of the test signals $T_1$ to $T_5$ to provide a corresponding one of the control signals $G_1$ to $G_5$ for the monitor TEGs 1 to 5.

Hereinafter, the circuit operation when process parameters are monitored will be described by way of an example of testing the monitor TEG 2. At this time, the enable gates 8 and 9 are respectively disabled by enable signals $E_1$ and $E_2$ from connecting the output data $DATA_1$ and $DATA_2$ produced by the normal operation of the semiconductor device to the external terminals 11 and 12.

In FIG. 2, assumes that the test signal $T_0$ at a high level is input to the external terminal 11, the test signal $T_2$ is high, and the test signals $T_1$, $T_3$, $T_4$ and $T_5$ are all low. Then, the output $G_2$ of the TEG control circuit 6 is low, while the other outputs $G_1$ and $G_2$ to $G_5$ are all high.

In the upper left portion of the chip 10 shown in FIG. 1, there is illustrated in detail the circuit arrangement of the monitor TEG 2. As shown, the monitor TEG 2 consists of a five-stage ring oscillator whose first-stage two-input NOR gate 21 has its one input connected to receive the output $G_2$ of the TEG control circuit 6. In this embodiment, the monitor TEGs 1 to 5 are each formed from a ring oscillator having a two-input NOR gate at its first stage.

If $G_2$ is high, then the output of the two-input NOR gate 21 is fixed at the low level irrespective of whether the ring oscillator output fed from the final-stage inverter 25 back to the other input of the NOR gate 21 is high or low, so that the ring oscillator is placed in the oscillation stopped state. If $G_2$ is low, on the other hand, then the two-input NOR gate 21 operates as an inverter, enabling the ring oscillator consisting of five inverters 21 to 25 (an odd number of inverters) to oscillate.

Thus, of the output signals $A_1$ to $A_5$ of the monitor TEGs 1 to 5, only the output $A_2$ is placed in the oscillating state and the other outputs $A_1$, $A_3$, $A_4$ and $A_5$ are placed in the stopped state. As described above, since, in the oscillation disabled state, the output of the two-input NOR gate 21 is fixed at the low level, the output of the corresponding ring oscillator is fixed at the low level. Thus, the outputs $A_1$, $A_3$, $A_4$ and $A_5$ of the other monitor TEGs in the disabled state are also fixed at the low level. Therefore, only the output $A_2$ of the ring oscillator 2 placed in the oscillation enabled state is sent through the five-input NOR gate 7 to the external terminal 12. The five-input NOR gate 7 may be replaced with a five-input OR gate.

The detection of the output $A_2$ of the monitor TEG in the oscillation enabled state allows verification of the operating speed of transistors that are main constituent elements in the semiconductor device and the integrity of the characteristics of inverters formed of the transistors, that is, logic gates in the semiconductor device properly functioning. The transistors may be of either MOS or bipolar type.

Likewise, if the test signal $T_0$ at the high level is applied to the external terminal 11 and one of the test signals $T_1$, $T_3$, $T_4$ and $T_5$ is set high with the test signal $T_2$ set low, then a corresponding one of the monitor TEGs 1, 3, 4 and 5 is placed in the oscillating state and its output is transferred to the external terminal 12.

In order to terminate the process parameter monitoring by the monitor TEG test circuit and operate the semiconductor device in the chip, it is only required to enable the enable gates 8 and 9 through the enable signals $E_1$ and $E_2$ to transfer the $DATA_1$ and $DATA_2$ of output data of the semiconductor device to the external terminals 11 and 12. This configuration prevents the number of external terminals of the semiconductor device from increasing irrespective of the formation of the monitor TEG test circuit on the same chip.

If the test signals $T_0$ is set low, all the monitor TEGS each consisting of a ring oscillator as shown in FIG. 1 can be placed in the oscillation disabled state. To input each of the test signals $T_1$ to $T_5$ as well, an external terminal of the semiconductor device can be used which is associated with an enable gate as with the external terminal 11 for the test signal $T_0$.

Likewise, a monitor TEG test circuit can be formed on a chip, which is arranged to allow a TEG control circuit to make a selection from n monitor TEGs through the use of test signals $T_0$ and $T_1$ to $T_n$ (n is an integer of more than one) and is equipped with a programmable external terminal structure controlled by enable signals $E_1$ and $E_2$ to allow the test signals to be applied to the control circuit. This will also perform readily the process parameter monitoring after the assembly process. As the enable signals, use may be made of the test signal $T_0$ by way of example.

Next, a second embodiment of the present invention will be described with reference to FIG. 3. Like the first embodiment, the second embodiment comprises monitor TEGs 31 to 35 for extracting process parameters, a TEG control circuit 36 for selectively controlling the monitor TEGs, an enable gate 37, buffers 38 and 39, and external terminals 40, 41, and 42. The second embodiment is characterized in that each of the monitor TEGs 31 to 35 consists of a single MOS transistor and analog signals for measuring the characteristics of each MOS transistor are applied to external terminals.

More specifically, in the monitor TEG test circuit shown in FIG. 3, the monitor TEGs 31 to 35 are formed at the four corners and on the inside of a semiconductor chip 10, the TEG control circuit 36 selectively applies a gate voltage to the gate electrode of a MOS transistor to be tested, the external terminal 40 applies a test signal $T_0$ to the TEG control circuit 36 which applies a gate voltage to the MOS transistors as will be explained in FIG. 4, the external terminal 41 applies a source voltage (normally ground voltage) to the MOS transistors, and the external terminal 42 applies a drain voltage to the MOS transistors to measure drain current.

Figure 4:
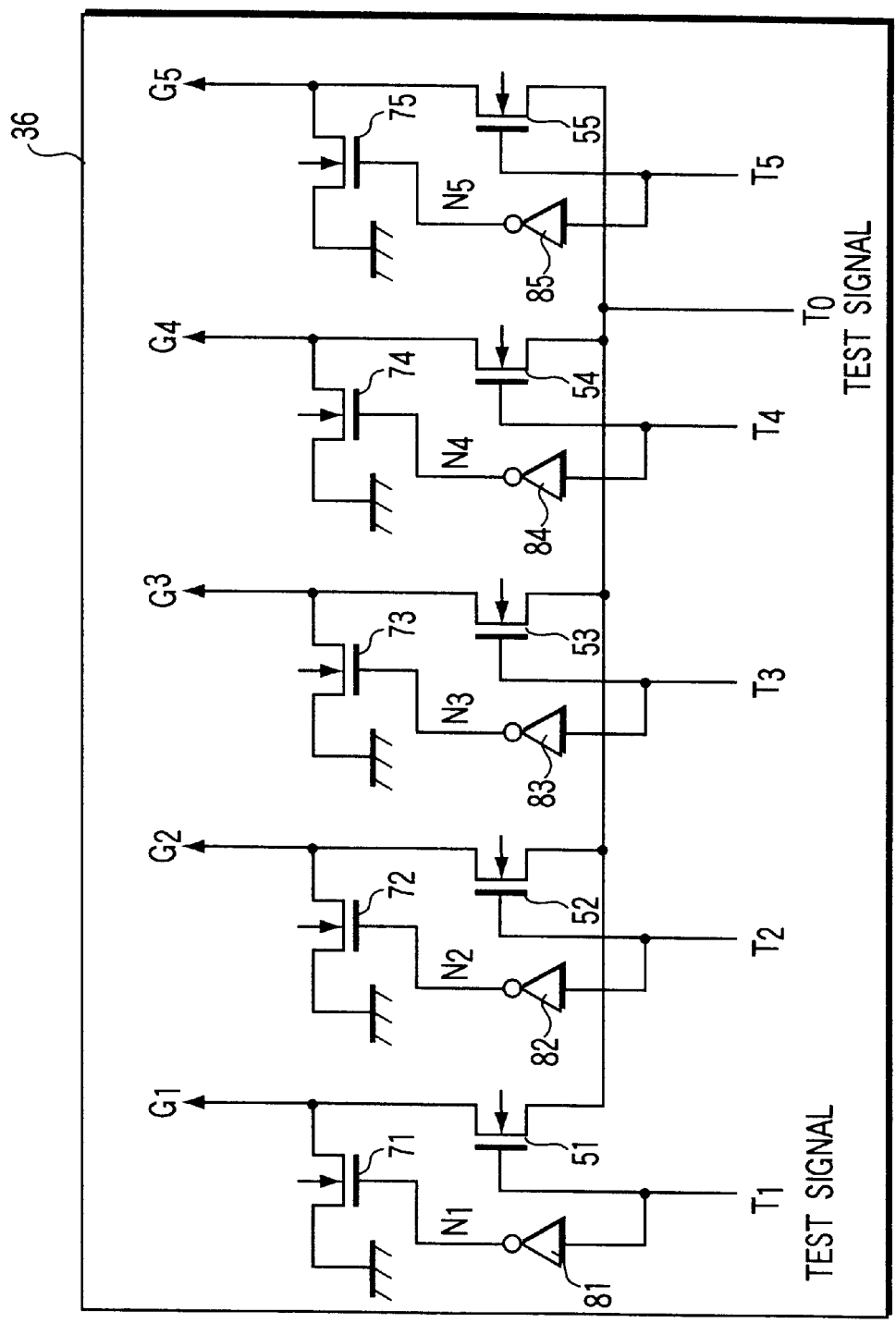
FIG. 4 shows an arrangement of the TEG control circuit of FIG. 3.

As shown in FIG. 4, the TEG control circuit 36 is supplied with test signals $T_0$ and $T_1$ to $T_5$ to produce control signals (gate voltage) $G_1$ to $G_5$ that enable the monitor TEGs 1 to 5, respectively. With the external terminal 40 is associated an enable gate 37 that allows that terminal to double as a data output terminal for a bit of output data, $DATA_1$, of the semiconductor device after the termination of testing of the monitor TEGs 31 to 35. Likewise, buffer circuits 38 and 39 are associated with the external terminals 41 and 42, respectively, which allow those terminals to double as input terminals for two input data, $DATA_2$ and $DATA_3$, to the semiconductor device after the termination of testing of the monitor TEGS.

Hereinafter, the circuit operation when process parameters are monitored will be described in terms of an example of testing the characteristics of the MOS transistor in the monitor TEG 32.

In FIG. 4, the arrangement of the TEG control circuit 36 is illustrated in detail. The TEG control circuit 36 is composed of first to fifth partial circuits $N_1$ to $N_5$ which are connected in parallel and formed from first transistors 51 to 55 and second transistors 71 to 75, each consisting of an N-type MOS transistor, and inverters 81 to 85.

First, the test signal $T_0$ is applied to the external terminal 40 of FIG. 3. As shown in FIG. 4, the TEG control circuit 36 is supplied with the test signals $T_1$ to $T_5$ for making a selection from the monitor TEGs 32 as well as the test signal $T_0$.

To select the monitor TEG 32, the test signal $T_2$ is set high and the other test signals $T_1$, $T_3$, $T_4$ and $T_5$ are set low. In FIG. 4, when the test signal $T_2$ is high, the first transistor 52 is turned ON. The test signal $T_2$ is inverted by the inverter 82 to the low level, turning OFF the second transistor 72 having its gate connected to the output of the inverter 82. This results in the output of the second partial circuit $N_2$ in the TEG control circuit 36 being isolated from ground, allowing the test signal $T_0$ to be output as the control signal $G_2$.

Since the test signals $T_1$, $T_3$, $T_4$ and $T_5$ are set low, on the other hand, the first transistors 51, 53, 54 and 55 are turned OFF and the second transistors 71, 73, 74 and 75 are turned ON. In the partial circuits $N_1$, $N_3$, $N_4$ and $N_5$ in the TEG control circuit 36, therefore, the test signal $T_0$ supplied through the external terminal 40 of FIG. 3 is cut off by the corresponding first transistors 51, 53, 54 and 55. At the same time, the outputs of the partial circuits are connected to ground by their corresponding second transistors 71, 73, 74 and 75. As a result, the outputs $G_1$, $G_3$, $G_4$ and $G_5$ of the TEG control circuit are all made low.

Thus, only the gate of the MOS transistor of the monitor TEG 32 in FIG. 3 is selected and supplied as its gate voltage $G_2$ with the test signal $T_0$ from the external terminal 40. The gates of the MOS transistors of the other monitor TEGs 31, 33, 34 and 35 are supplied with the outputs $G_1$, $G_3$, $G_4$ and $G_5$ of the TEG control circuit and are therefore grounded. If, in this case, the MOS transistors of the monitor TEGs are all of the normally off type, then the non-selected MOS transistors are all set to the OFF state.

The monitor TEGs 31 to 35 have their respective sources $A_1$ to $A_5$ and drains $B_1$ to $B_5$ connected in parallel between the external terminals 41 and 42. By applying a MOS transistor gate voltage to the external terminal 40, a source voltage to the external terminal 41, and a drain voltage to the external terminal 42, the current-voltage characteristics of the MOS transistor of the monitor TEG 32 can be measured closely with the gate voltage $G_2$ as a parameter.

Likewise, by setting any one of the test signals $T_1$ to $T_n$ (n is an integer of more than one) high, the characteristics of the MOS transistor of the corresponding one of n monitor TEGs can be tested closely.

Thus, the use of the programmable TEG control circuit 36 based on the test signals $T_0$ to $T_n$ allows process parameter monitoring after the assembly process with no need of any external terminal dedicated to monitor TEG testing.

In addition, manufacturing yield factors involved in large-scale integration of semiconductor devices can be analyzed closely by arranging n number of monitor TEGs, each consisting of a MOS transistor, at the four corners and on the inside of a semiconductor chip and testing arbitrarily and precisely the characteristics of MOS transistors constituting a semiconductor device.

The present invention may be practiced or embodied in still other ways. For example, although the first embodiment has been described as using a plurality of ring oscillators each composed of inverters connected in cascade as monitor TEGS, the ring oscillators may differ from one another in the gate length and width of MOS transistors used or in the number of inverters used. In addition, more complex circuits, such as ring counters, may be used to make a closer analysis of factors in failures occurring in internal gates of a semiconductor device.

Although the second embodiment has been described as using MOS transistors of the normally-off type as the monitor TEGs, MOS transistors of the normally-on type can be used instead provided that the ground level of the second N-type MOS transistors in FIG. 4 is replaced with a negative reference voltage. In addition, the constituent elements of the monitor TEGs need not necessarily be limited to MOS transistors. For example, bipolar transistors or other three-terminal devices may be used to constitute the monitor TEGS.

In order to use a two-terminal element, such as interconnection resistance, as a monitor TEG, it is only required to eliminate the gate of a monitor TEG in FIG. 3 to leave it as a two-terminal element, connect a switch in the form of a MOS transistor in series with that two-terminal element, and apply one of the control signals $G_1$ to $G_5$ to the gate of that MOS transistor.

An extension of the TEG control circuit shown in FIG. 4 will make it possible to use multi-terminal elements having more than three terminals as the constituent elements of the monitor TEGs. Although the second embodiment has been described as mainly testing the DC characteristics of the constituent elements of the monitor TEGs, it is also possible to test the pulse response or high-frequency characteristics of the constituent elements by applying a pulse voltage or high-frequency voltage to an external terminal.

Furthermore, a combination of the first and second embodiments will allow the dynamic characteristics and the static characteristics of MOS transistors that are main constituent elements of a semiconductor device to be measured further closely. Other embodiments and modifications are possible without departing from the scope and spirit of the present invention.

As described above, the monitor TEG test circuit of the present invention makes an analysis of factors in variations in process parameters, which was hitherto possible only with interlot, in-wafer or interwafer, or interchip variations, possible even with in-chip variations. In addition, an analysis of manufacturing yield factors of a large-scale integration semiconductor device can be conducted after the assembly process by testing arbitrarily and precisely variations in the characteristics of the monitor TEGs formed on a chip together with the semiconductor device.

That is, the use of the monitor TEG test circuit of the present invention allows monitor TEGs scattered in a chip to be tested selectively with ease through the use of programmable test signals. In addition, the external terminals can be kept from increasing for the purpose of process parameter monitoring. Thus, the shipment and reliability tests after assembly and a failure analysis of products failed at the user site can be made without opening packages.

By forming the monitor TEG test circuit of the present invention on a chip together with a high-density, high-integration semiconductor device and feeding test information back to the site of manufacture, a significant improvement in the manufacturing yield and reliability of the semiconductor device can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A test circuit for a plurality of monitor test element groups (TEGs), which are formed on a semiconductor chip together with a semiconductor device and placed in selected positions scattered in the chip, wherein the test circuit selectively tests the monitor TEGs to thereby monitor variations in process parameters within the chip, the test circuit comprising:

a TEG control circuit responsive to externally applied test signals $T_0$ and $T_1$ to $T_n$ for outputting control signals $G_1$ to $G_n$ to control the monitor TEGs, respectively; and at least one data output terminal of the semiconductor device which is diverted by an enable signal to an input terminal for one of the test signals $T_0$ to $T_n$, wherein the at least one data output terminal of the semiconductor device is connected to an input of the TEG control circuit.

2. The test circuit according to claim 1, wherein at least one of external terminals of the semiconductor device is used in common as an input/output terminal of the test circuit, and the external terminals of the semiconductor device which are used to input and output data are programmed by test signals to serve as input/output terminals of the test circuit.

3. A test circuit for n, where n is an integer greater than one, monitor test element groups (TEGs), which are formed on the same chip as a semiconductor device is formed and placed in selected positions in the chip, wherein the test circuit selectively tests the monitor TEGs to thereby monitor variations in process parameters within the chip and each of the monitor TEGs consists of a ring oscillator, the test circuit comprising:

a TEG control circuit responsive to externally applied test signals $T_0$ and $T_1$ to $T_n$ for outputting control signals $G_1$ to $G_n$ to control the number n of monitor TEGs, respectively;

an n-input NOR gate or n-input OR gate responsive to outputs $A_1$ to $A_n$ of the monitor TBGs for outputting one of the outputs $A_1$ to $A_n$ of the monitor TEGs;

at least one data output terminal of the semiconductor device which is diverted by an enable signal to an input terminal for one of the test signals $T_0$ to $T_n$; and a data output terminal of the semiconductor device which is diverted by an enable signal to an output terminal for the output of the n-input NOR or OR gate, wherein the at least one data output terminal of the semiconductor device is connected to an input of the TEG control circuit, outputs of the TEG control circuit for outputting the control signals $G_1$ to $G_n$ are connected to the inputs of the monitor TEGs, respectively, and the output of the n-input NOR or OR gate is connected to the data output terminal of the semiconductor device.

4. The test circuit according to claim 3, wherein the ring oscillator has a two-input NOR gate to receive a corresponding one of the control signals $G_1$ to $G_n$.

5. The test circuit according to claim 3, wherein the test signal $T_0$ is used in common as the enable signals.

6. The test circuit according to claim 3, wherein the TEG control circuit comprises n two-input NAND gates each having an input the connected to receive the test signal $T_0$ and another input thereof connected to receive a respective one of the test signals $T_1$ to $T_n$, and the n two-input NAND gates provide a respective one of the control signals $G_1$ to $G_n$.

7. A test circuit for n, where n is an integer greater than one, monitor test element groups (TEGs), which are formed on the same chip as a semiconductor device is formed and placed in selected positions in the chip, wherein the test circuit selectively tests the monitor TEGs to thereby monitor variations in process parameters within the chip and each of the monitor TEGs consists of three-terminal elements having first, second and third terminals, the test circuit comprising:

a TEG control circuit responsive to externally applied test signals $T_0$ and $T_1$ to $T_n$ for outputting control signals $G_1$ to $G_n$ to control the n number of monitor TEGs, respectively;

a first external terminal for inputting first input data to the semiconductor device via a buffer circuit;

a second external terminal for inputting second input data to the semiconductor device via a buffer circuit; and at least one data output terminal of the semiconductor device which is diverted by an enable signal to an input terminal for one of the test signals $T_0$ and $T_1$ to $T_n$, wherein the at least one data output terminal of the semiconductor device is connected to an input of the TEG control circuit, and the three-terminal element in each of the monitor TEGs has the first terminal thereof connected to the first external terminal, the second terminal thereof connected to the second external terminal and the third terminal thereof connected to receive a corresponding one of the control signals $G_1$ to $G_n$ from the TEG control circuit.

8. The test circuit according to claim 7, wherein the three-terminal element is a MOS transistor, and the first, second and third terminals of the three-terminal element are the source, drain, and gate, respectively, of the MOS transistor.

9. The test circuit according to claim 7, wherein the test signal $T_0$ is used as the enable signal.

10. The test circuit according to claim 7, wherein the TEG control circuit comprises n partial circuits connected in parallel, each of which comprises first and second MOS transistors and one inverter, each of the partial circuits has a first input connected to receive the test signal $T_0$ at the source of the corresponding first MOS transistor, a second input connected to receive a respective one of the test signals $T_1$ to $T_n$ at the input of the corresponding inverter, and an output connected in common to the drains of the corresponding first and second MOS transistors for providing a corresponding one of the output signals $G_1$ to $G_n$, and the second MOS transistor has a gate thereof connected to the output of the corresponding inverter and a source thereof connected to a reference voltage.

* * * * *